United States Patent
Yoo et al.

(10) Patent No.: US 9,941,171 B1
(45) Date of Patent: Apr. 10, 2018

(54) METHOD FOR FABRICATING LDMOS WITH REDUCED SOURCE REGION

(71) Applicant: Monolithic Power Systems Inc., San Jose, CA (US)

(72) Inventors: Ji-Hyoung Yoo, Los Gatos, CA (US); Joel M. McGregor, Issaquah, WA (US); Eric K. Braun, Mountain View, CA (US)

(73) Assignee: Monolithic Power Systems, Inc., San Jose, CA (US)

( * ) Notice: Subject to any disclaimer, the term of this patent is extended or adjusted under 35 U.S.C. 154(b) by 0 days.

(21) Appl. No.: 15/356,515

(22) Filed: Nov. 18, 2016

(51) Int. Cl.
| H01L 21/8234 | (2006.01) |
| H01L 29/66 | (2006.01) |
| H01L 21/265 | (2006.01) |
| H01L 21/266 | (2006.01) |
| H01L 29/10 | (2006.01) |
| H01L 29/08 | (2006.01) |
| H01L 27/088 | (2006.01) |

(52) U.S. Cl.
CPC .... *H01L 21/823425* (2013.01); *H01L 21/266* (2013.01); *H01L 21/26586* (2013.01); *H01L 21/823493* (2013.01); *H01L 27/088* (2013.01); *H01L 29/0882* (2013.01); *H01L 29/1095* (2013.01); *H01L 29/66681* (2013.01)

(58) Field of Classification Search
CPC ..................... H01L 21/26586; H01L 29/66681
USPC ........................................................ 438/302
See application file for complete search history.

(56) References Cited

U.S. PATENT DOCUMENTS

| 6,252,278 | B1 | 6/2001 | Hsing |
| 6,518,138 | B2 | 2/2003 | Hsing |
| 7,713,853 | B2* | 5/2010 | Frisina .................. H01L 21/046 438/268 |
| 8,546,879 | B2 | 10/2013 | Disney et al. |
| 9,159,795 | B2 | 10/2015 | Yoo et al. |
| 9,502,251 | B1 | 11/2016 | McGregor et al. |
| 2002/0125540 | A1* | 9/2002 | Shimotsusa .......... B41J 2/14072 257/467 |
| 2004/0251492 | A1* | 12/2004 | Lin ................... H01L 29/66689 257/335 |
| 2009/0283827 | A1* | 11/2009 | Pendharkar ......... H01L 29/0847 257/343 |

* cited by examiner

*Primary Examiner* — Marcos D Pizarro Crespo
*Assistant Examiner* — Antonio Crite
(74) *Attorney, Agent, or Firm* — Perkins Coie LLP

(57) ABSTRACT

A method for fabricating a semiconductor device including: forming a block layer above a well region of a first doping type in a semiconductor substrate, wherein the block layer has an opening for defining a first region in an upper part of the well region and has sidewalls at sides of the opening; implanting dopants of a second doping type into the well region through the opening of the block layer to form the first region; implanting dopants of the first doping type into the first region in the manner of large-angle-tilt dopants implantation to form a second region for a first transistor, and to form a third region for a second transistor; and forming, for both of the first transistor and the second transistor, a fourth region between the second region and the third region.

6 Claims, 7 Drawing Sheets

METHOD FOR FABRICATING LDMOS WITH REDUCED SOURCE REGION

TECHNICAL FIELD

The present invention generally relates to semiconductor devices, and more particularly but not exclusively relates to methods for forming reduced source regions in the semiconductor devices.

BACKGROUND

LDMOS (Lateral Diffused Metal Oxide Semiconductor) devices are widely used for high breakdown voltage, high current and good thermal performance in many applications including laptop, server and DC/DC converter.

A LDMOS device commonly comprises a number of transistors which are formed in pairs. FIG. 1 shows cross-sectional view of a LDMOS device comprising a pair of transistors T1 and T2 formed in an N well 16. Each transistor comprises a drain pickup region 11, a source region 12, a gate 13, while the two transistors share a common body region 14 and a body pickup region 15. For performance and cost reasons, many modern applications require smaller power devices in a smaller package. Much focus has been placed on drain region engineering that includes RESURF (Reduced Surface Field), graded doped drain. Another area of focus is on making the source region smaller. As shown in FIG. 1, a source/body region consists of the body pickup region 15 in the center and the source regions 12 located on both sides of the body pickup region 15, which form an N+/P+/N+ region. Reducing the N+/P+/N+ region would result in a smaller source region. But usually the minimum area of the N+/P+/N+ region is limited by the photo-masking equipment's capability.

SUMMARY

It is an object of the present invention to provide a process making reduced source region by large angle tilt dopants implantation to form the source regions instead of using a photo/masking step. During the large angle tilt dopants implantation, an implanting direction of dopants has a certain angle with the vertical direction of horizontal plane of the LDMOS poly gate. As a result, the present invention achieves reduced source regions of a LDMOS device.

The embodiments of the present invention are directed to a manufacturing process of a semiconductor device, comprising: forming a well region of a first doping type in a semiconductor substrate; forming a gate insulating layer above the well region; forming a gate layer above the gate insulating layer; forming, above the gate layer, a masking layer having an opening for defining a body region in an upper part of the well region; etching through the gate layer under the opening of the masking layer to expose the well region, wherein the gate layer has sidewalls above the defined body region after etching; implanting dopants of a second doping type into the well region through the opening of the masking layer to form the body region; implanting dopants of the first doping type into the body region in a manner of large-angle-tilt dopants implantation to form source regions respectively for a first transistor and a second transistor, using both of the gate layer and the masking layer as a block layer for large-angle-tilt dopants implantation; removing the masking layer after implanting dopants of the first doping type into the body region; forming gates respectively for the first transistor and the second transistor; forming drain pickup regions respectively for the first transistor and the second transistor; and forming, for both of the first transistor and the second transistor, a body pickup region.

The embodiments of the present invention are also directed to a method for fabricating a semiconductor device, comprising: forming a block layer above a well region of a first doping type in a semiconductor substrate, wherein the block layer has an opening for defining a first region in an upper part of the well region and has sidewalls at sides of the opening; implanting dopants of a second doping type into the well region through the opening of the block layer to form the first region; implanting dopants of the first doping type into the first region in the manner of large-angle-tilt dopants implantation to form a second region for a first transistor, and to form a third region for a second transistor; and forming, for both of the first transistor and the second transistor, a fourth region between the second region and the third region.

The embodiments of the present invention are further directed to a LDMOS device comprising a first transistor and a second transistor, comprising: forming a well region in a semiconductor substrate; forming a gate insulating layer above the well region; forming a gate layer above the gate insulating layer; forming a top gate seal layer above the gate layer; forming a first masking layer above the top gate seal layer; etching through the top gate seal layer and the gate layer under an opening of the first masking layer to expose an opening for defining a body region in an upper part of the well region, wherein the gate layer has sidewalls above the defined body region after etching; implanting P type dopants into the well region under the opening of the first masking layer to form the body region in the upper part of the well region; implanting N type dopants into the body region in a manner of large-angle-tilt dopants implantation to form a first source region for the first transistor, and to form a second source region for the second transistor, using the gate insulating layer, the gate layer, the top gate seal layer and the first masking layer as a block layer for large-angle-tilt dopants implantation; removing the first masking layer; forming a second masking layer above an upper surface of the semiconductor substrate; etching the gate layer through openings of the second masking layer to form a first gate for the first transistor, and to form a second gate for the second transistor; removing the second masking layer; forming a third masking layer above the upper surface of the semiconductor substrate; implanting N type dopants into the well region under openings of the third masking layer to form a first drain pickup region for the first transistor, and to form a second drain pickup region for the second transistor; removing the third masking layer; forming a fourth masking layer above the upper surface of the semiconductor substrate; implanting P type dopants into the well region under opening of the fourth masking layer to form a body pickup region for both the first transistor and the second transistor; and removing the fourth masking layer.

BRIEF DESCRIPTION OF THE DRAWINGS

The present invention can be further understood with reference to the following detailed description and the appended drawings, wherein like elements are provided with like reference numerals. The drawings are only for illustration purpose. They may only show part of the devices and are not necessarily drawn to scale.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

The terms "left," "right," "in," "out," "front," "back," "up," "down, "top," "atop", "bottom", "over," "under," "beneath," "above," "below" and the like in the description and the claims, if any, are used for descriptive purposes and not necessarily for describing permanent relative positions. It is to be understood that the terms so used are interchangeable under appropriate circumstances such that embodiments of the technology described herein are, for example, capable of operation in other orientations than those illustrated or otherwise described herein.

Figure 2:
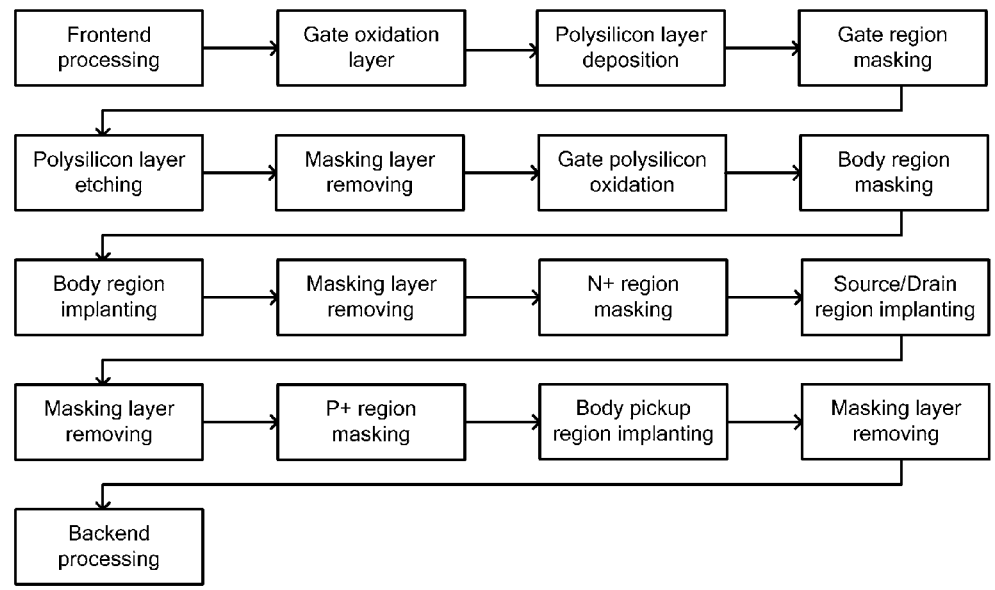
FIG. 2 shows a process flowchart outlining a prior art manufacturing process that could be used to fabricate the LDMOS device.

FIG. 2 shows a process flowchart outlining a prior art manufacturing process that could be used to fabricate a LDMOS device. The prior art manufacturing process may comprise steps of a frontend processing, gate oxidation, polysilicon layer deposition, gate region masking, polysilicon layer etching, masking layer removing, gate polysilicon oxidation, body region masking, body region implanting, masking layer removing, N+ region masking, source/drain region implanting, masking layer removing, P+ region masking, body pickup region implanting, masking layer removing and a backend processing. The frontend processing may comprise preparing an original substrate, forming N type buried layer (NBL), growing epitaxial layer (EPI), and defining active areas. And in some applications, the frontend processing further comprises forming a thick gate oxidation layer. Backend processing may comprise forming electrodes for the source region, the drain region, the body pickup region and the gate, and then distributing metal layer. Persons of ordinary skill in the art should know that a masking step, also referred as photo-masking step, means to form a masking layer with certain openings for defining determined areas on a top surface of a whole semiconductor substrate. For example, step of body region masking comprises forming a masking layer on the top surface of the whole semiconductor substrate, and patterning the masking layer to form openings to define the body regions. The masking layer may comprise a photoresist layer.

Figure 1:
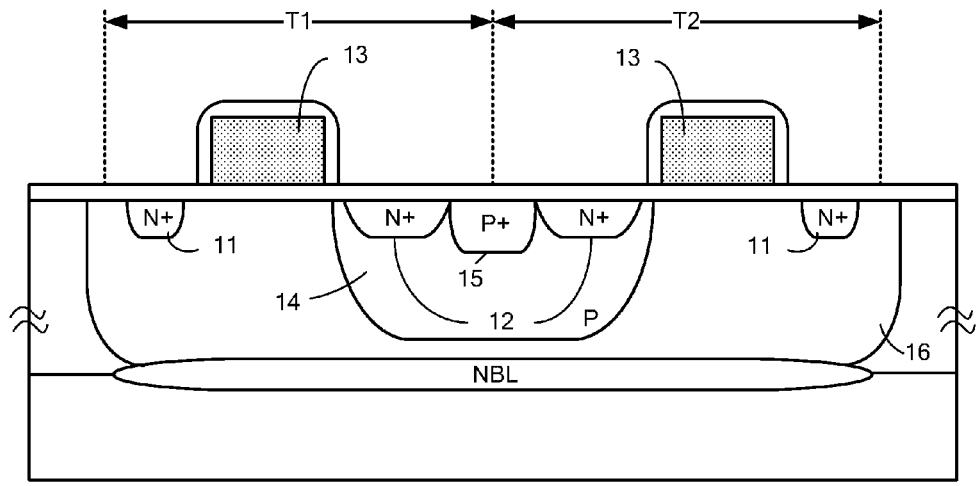
FIG. 1 shows a prior art LDMOS device.
Figure 3A:
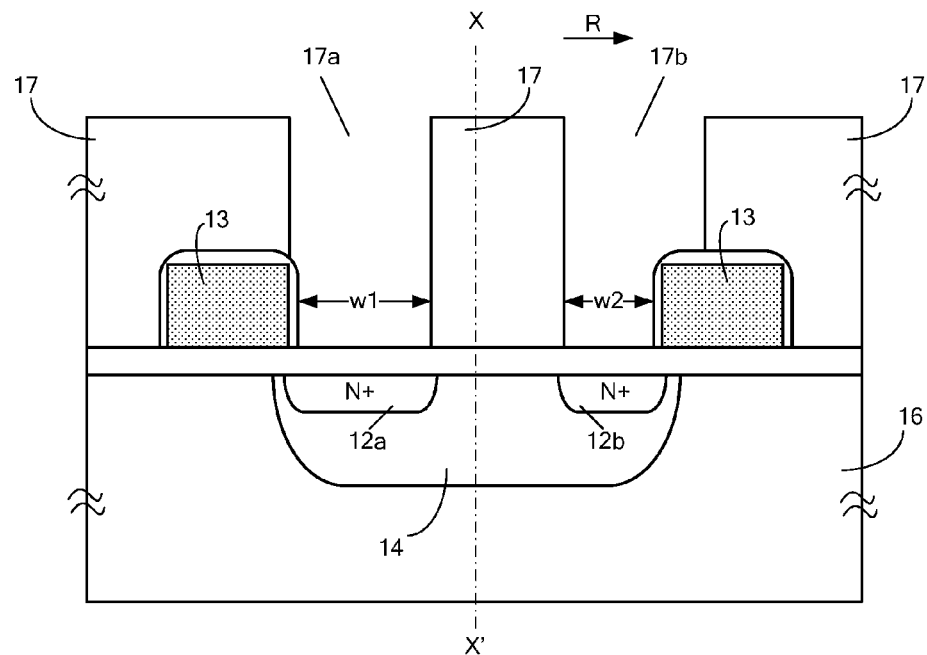
FIGS. 3a-b show cross views of the source regions 12a and 12b, and the body pickup region 15, formed with traditional photo-masking process.
Figure 3B:
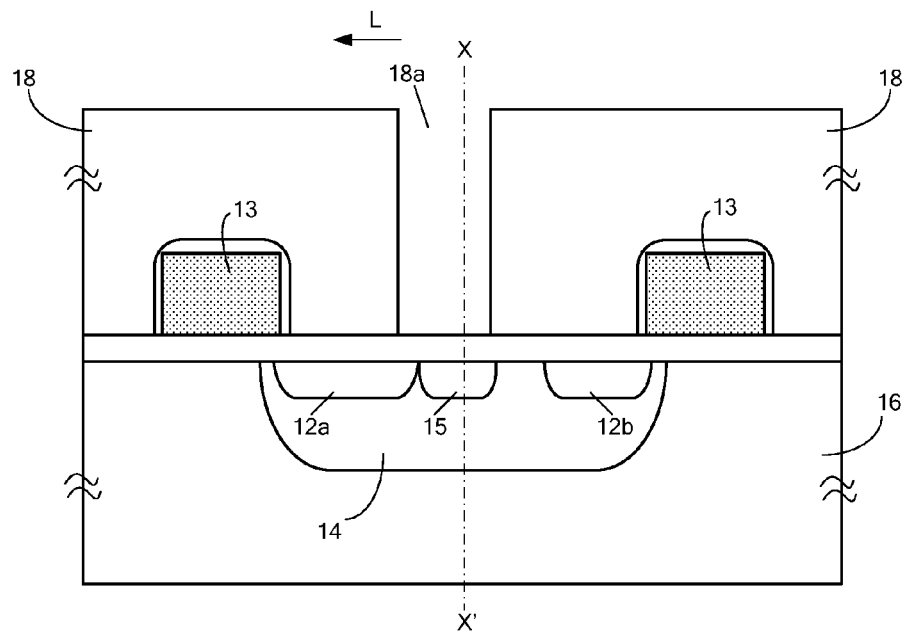

As can be seen from FIG. 2, the body region, the body pickup region and the source/drain region are formed by traditional photo-masking and dopants implantation technique. As a result, the area of an opening for defining the source/body region, i.e., the N+/P+/N+ region in FIG. 1 would apparently be limited by the photo-masking equipment's capability. And even worse, photo-masking process can not precisely control the area of the region to be implanted. FIGS. 3a and 3b show cross views of source regions 12a and 12b, and the body pickup region 15, formed with traditional photo-masking process. In FIG. 3a, a masking layer 17 with openings 17a and 17b is formed on a top surface of the semiconductor substrate. Because of alignment error, the openings 17a and 17b may shift towards direction R from the axis wire X-X', and maybe asymmetric to the axis wire X-X' which is in the middle of the gates 13. Then, after implanting dopants to the body region 14 though the openings 17a and 17b, a width w1 of the source region 12a is larger than a width w2 of the source region 12b, as illustrated in FIG. 3a. During the photo-masking process defining the body pickup region 15 in FIG. 3b, the opening 18a for defining the body pickup region 15 may shift towards an opposite direction L from the axis wire X-X'. After dopants implantation, the body pickup region 15 shifts away from the middle of the gates 13, and is narrower than expected, because the opening for defining the body pickup region 15 overlaps the source region 12a, and the N+ doping for the source region 12a wins over P+ doping for the body pickup region 15 in a silicon substrate when having a similar doping level.

FIGS. 4a-g illustrate a process to fabricate a LDMOS device with reduced source region in accordance with an embodiment of the present invention. The present process comprises a large-angle-tilt dopants implantation step to form two source regions in both sides of a body region. Persons of ordinary skill in the art could adopt the present process to fabricate any other semiconductor device having a similar structure after reading the present invention.

Figure 4A:
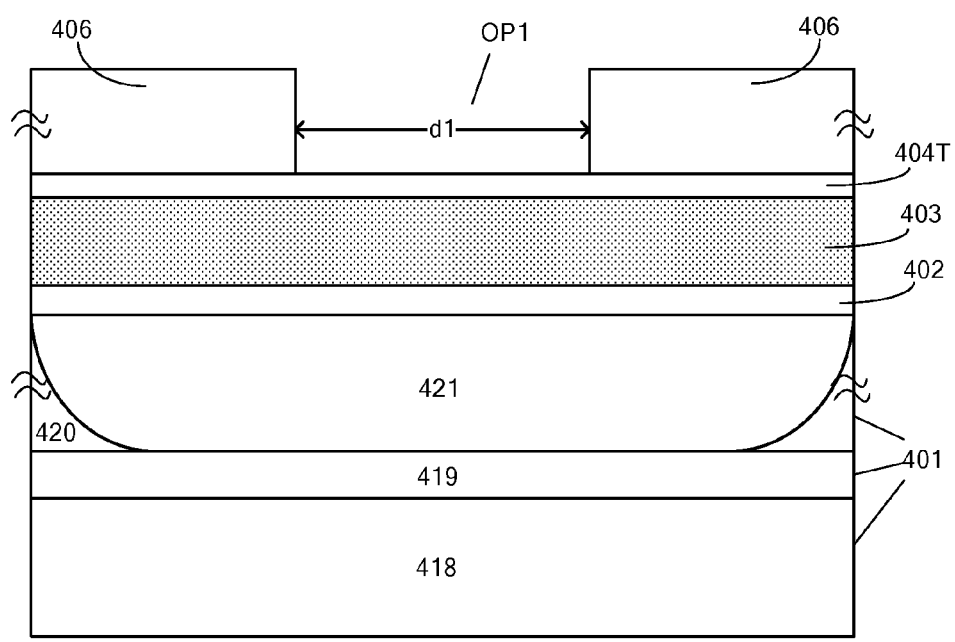
FIGS. 4a-g illustrate a process of fabricating the LDMOS device with small source in accordance with an embodiment of the present invention.

In FIG. 4a, a semiconductor substrate 401 is provided. The semiconductor substrate 401 comprises an original substrate 418, an N type Buried Layer (NBL) 419, an epitaxial layer 420 and a well region 421, also referred as a drain drift region. The original substrate 418 may be N type, P type or intrinsic semiconductor material. The NBL 419 may be replaced with other structures. The epitaxial layer 420 may be N type, P type or intrinsic semiconductor material. The N well 421 may be a high voltage well with light doping concentration. The LDMOS device will be formed in the N well 421. The semiconductor substrate 401 may have other circuit(s)/device(s)/system(s) integrated together with the LDMOS device in it. For example, in a BCD process, several devices, e.g., BJT (Bipolar Junction Transistor), CMOS (Complemented MOS devices) would be integrated with LDMOS in a same substrate. In some embodiments, the semiconductor substrate may have other configuration or may be without some of the aforementioned regions. In FIG. 4a, a gate insulating layer 402 is formed on a top surface of the semiconductor substrate 401 and is adopted as a dielectric layer. The gate insulating layer 402 may comprise silicon oxide and may be formed by oxidation process or oxide deposition process. Next, on a top surface of the gate insulating layer 402, polysilicon deposition is performed to form a polysilicon layer, i.e., a gate layer 403, which is later patterned as the gate of the LDMOS device by etching through a masking layer. After that, a top gate seal layer 404T is formed on a top surface of the gate layer 403 by either polysilicon oxidation process or oxide deposition process. Next, a first masking layer 406 on a top surface of the top gate seal layer 404T is formed by performing a lithographic process. The first masking layer 406 comprises at least an opening OP1 through to the top surface of the top gate seal layer 404T, to defined a body region in the N well 421. The opening OP1 is also referred as a body region opening and may be formed by dissolving a defined area in the first masking layer 406 after exposure to light. In one embodiment, a width d1 of the opening OP1 as shown in FIG. 4a may be in a range of 0.3 µm-0.5 µm. In FIGS. 4b-g, the original substrate 418, the NBL 419 and the epitaxial layer 420 are not shown for clarity.

Figure 4B:
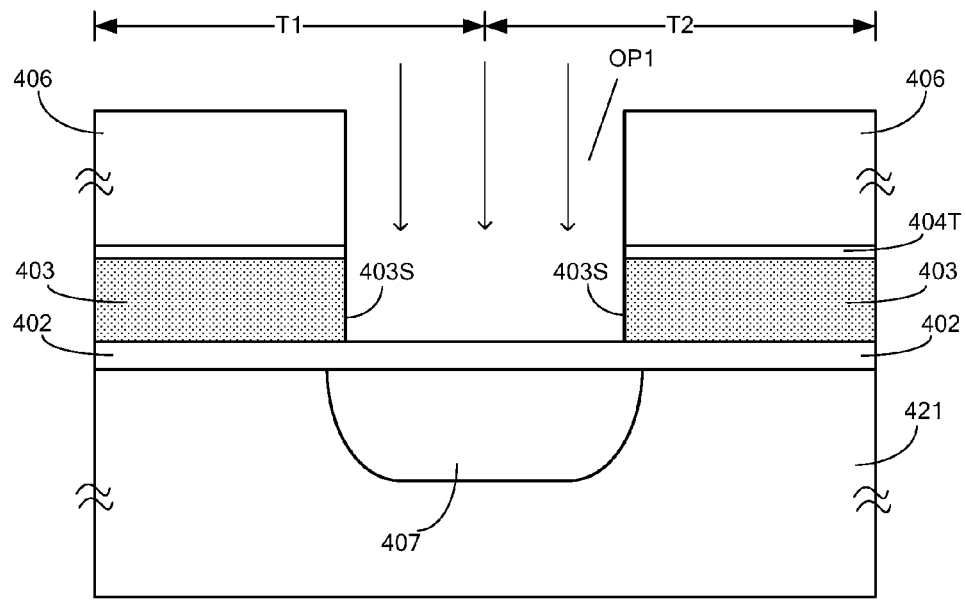

In FIG. 4b, the gate layer 403 is etched through the opening OP1 to expose part of the N well 421 covered with gate insulating layer 402. After that, a first region 407, i.e., a body region 407, is formed by implanting P type dopants into an upper surface of the N well 421 under the opening OP1. As can be seen from FIG. 4b, the gate layer 403 has sidewalls 403S above the body region 407 after etching.

Figure 4C:
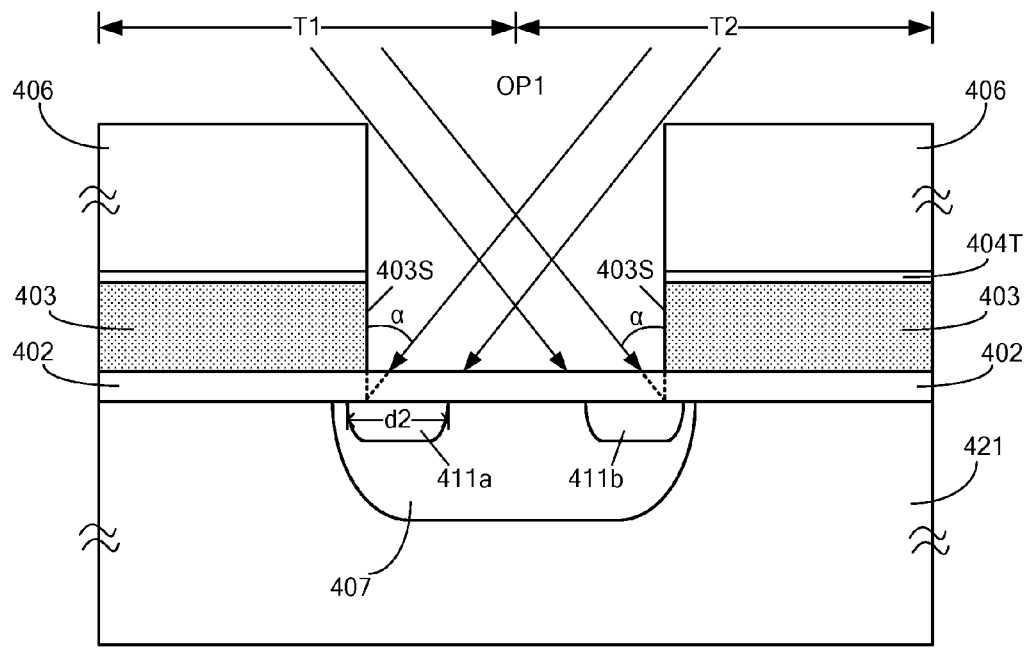

In FIG. 4c, large-angle-tilt dopants implantation is performed successively to form a second region 411a, i.e., source region 411a, for a first transistor T1 and to form a third region 411b, source region 411b, for a second transistor T2, wherein the first transistor T1 and the second transistor T2 are one pair of a number of transistors constituting the LDMOS device. During each large-angle-tilt dopants implantation, an implantation direction of N type dopants has an angle α with the sidewall 403S of the gate layer 403 as shown in FIG. 4c. The angle α is also referred as a tilt angle, because the angle α may be realized by tilting the whole wafer from a horizontal plane while keeping the implantation direction perpendicular to the horizontal plane.

During the large-angle-tilt dopants implantation, the gate layer 403 and the first masking layer 406 constitutes a block layer from dopants implanting. The top gate seal layer 404T is a thin layer and could be ignored. In one embodiment, a thickness of the block layer comprising the gate layer 403 and the first masking layer 406, the width d1 of the opening OP1, and the angle α are defined such that a width d2 of each source region is less than 0.15 µm. In one embodiment, the thickness of the block layer comprising the gate layer 403 and the first masking layer 406, the width d1 of the opening OP1, and the angle α are defined such that the width d2 of each source region is in a range of 0.1 µm~0.15 µm.

In one embodiment, the block layer may comprise a number of layers other than the gate layer 202 and the masking layer 406. In other embodiment, the block layer may comprise any single implantation hard mask. The block layer has an opening for a defined region and blocks dopants implantation to undefined regions.

In one embodiment, the angle α is in a range of 15 degree to 30 degree. For a given thickness of the gate layer 403 and the first masking layer 406, and a given width d1 of the opening OP1, the larger the angle α, the smaller width of the source regions 411a and 411b. In other words, the width d2 of the source regions 411a and 411b may be adjusted by changing the angle α between the sidewall 403S and the implantation direction of the N type dopants. In some embodiments, the source regions 411a and 411b are not necessarily to have the same width. In that case, different angles during the successive large-angle-tilt dopants implantation are adopted to obtain different width of the source regions.

The large-angle-tilt dopants implantation makes precisely controlled source regions and has no alignment error at all. Furthermore, the width of the source region is controlled by changing the angle α which enables a much narrower region than a traditional photo-masking process.

Figure 4D:
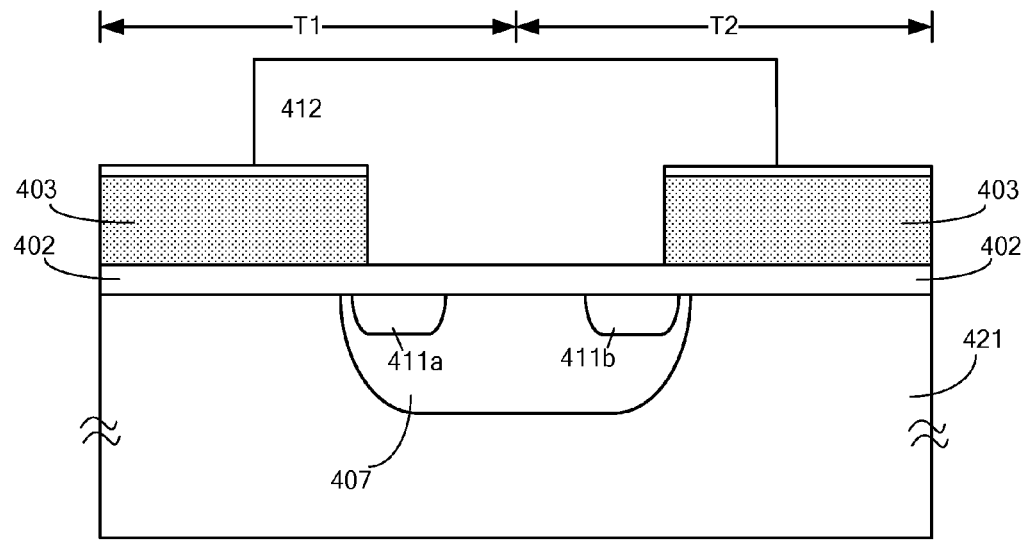

In FIG. 4d, the first masking layer 406 is removed. A second masking layer 412 is formed above the top surface of the semiconductor substrate 401. The second masking layer 412 has certain openings to the gate layer 403 for patterning gates for transistors T1 and T2 as shown in FIG. 4d.

Figure 4E:
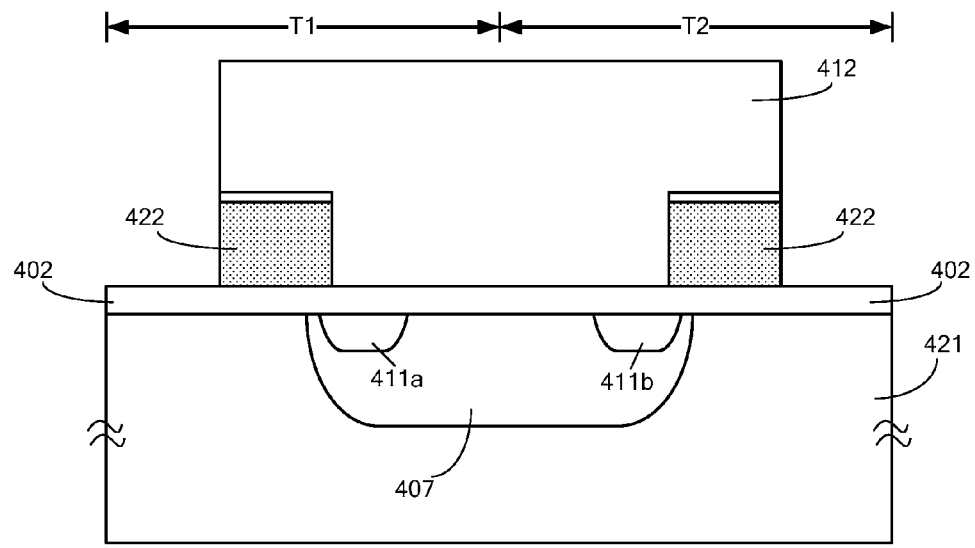

In FIG. 4e, the gate layer 403 is etched through under the openings of the second masking layer 412 to form gates 422 for the transistors T1 and T2. After forming the gates 422, the second masking layer 412 is removed, and an oxidation process may be performed to complete a gate seal layer 404 so as to wrap the gate 422 as shown in FIG. 4f, wherein the top gate seal layer 404T is part of the gate seal layer 404.

Figure 4F:
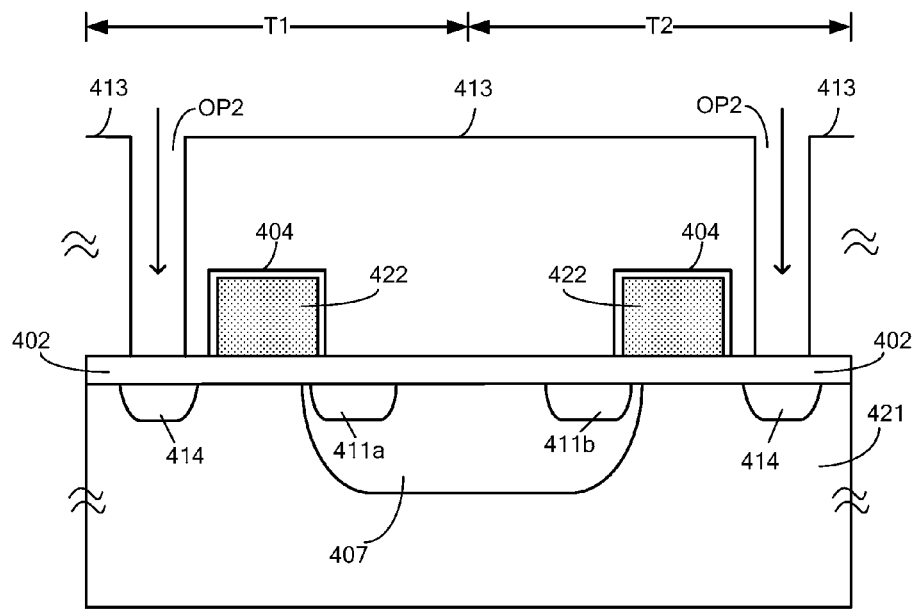

In FIG. 4f, a third masking layer 413 is formed. The third masking layer 413 comprises positioned openings OP2 to define drain pickup regions 414 for the transistors T1 and T2. The drain pickup regions 414 are then formed by implanting N type dopants into the N well 421 through the openings OP2. The third masking layer 413 is removed after forming the drain pickup regions 414.

Figure 4G:
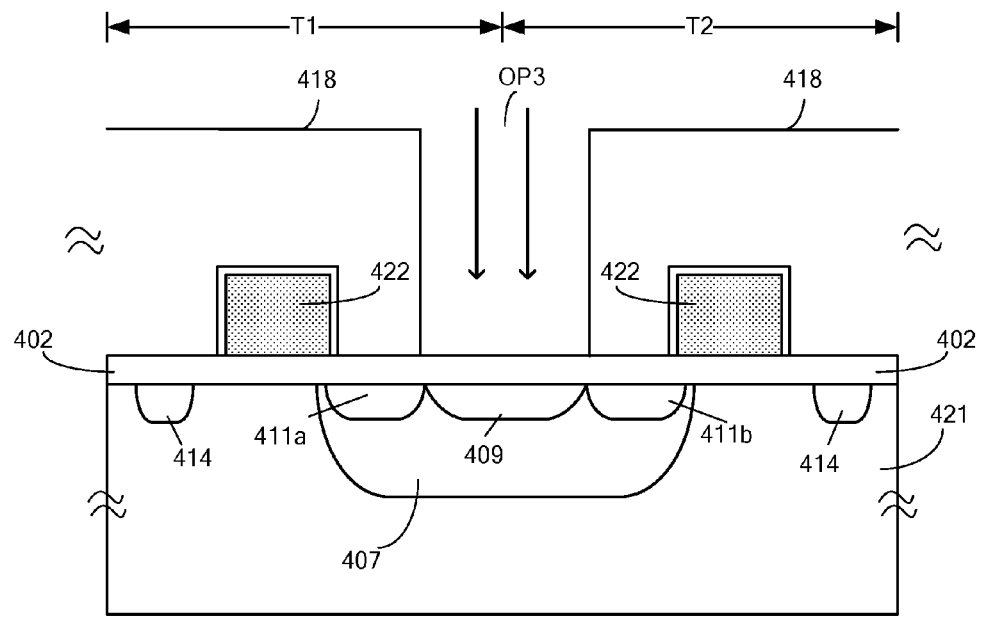

In FIG. 4g, a fourth masking layer 418 is formed. The fourth masking layer 418 comprises a positioned opening OP3 for defining a fourth region, i.e., a body pickup region 409, for both the transistors T1 and T2. The body pickup region 409 is then formed by implanting P type dopants into the body region 407 through the opening OP3. The fourth masking layer 418 is removed after forming the body pickup region 409.

The opening OP3 for defining the body pickup region 409 overlaps the source regions 411a and 411b in FIG. 4g. It is known that N+ dopants win over P+ dopants in a silicon layer when they have similar doping level. For this reason, the body pickup region 409 is determined by the source regions aside it. As long as the source region is precisely formed, and the opening OP3 overlaps the source regions 411a and 411b, the body pickup region is self-aligned without error.

Figure 5:
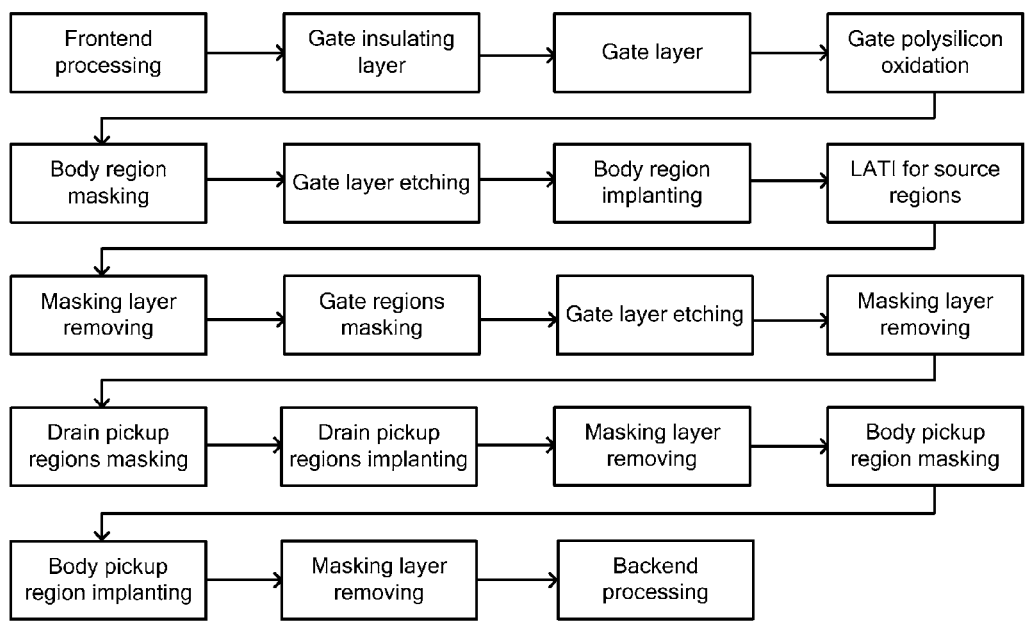
FIG. 5 shows a process flowchart outlining a manufacturing process that could be used to fabricate the LDMOS device of FIGS. 4a-g in accordance with an embodiment of the present invention.

FIG. 5 shows a process flowchart outlining a manufacturing process that could be adopted to fabricate the devices shown in FIGS. 4a-g in accordance with an embodiment of the present invention. Compared to prior art process shown in FIG. 2, large-angle-tilt dopants implantation is adopted to form source regions by using a gate layer and a masking layer as a block layer. Accordingly, the orders for forming different regions are adjusted. The width of the source region formed by the present invention could be controlled in a range of 0.1 µm~0.15 µm by adjusting a tilt angle of the wafer or by adjusting the dopants implantation direction, which is much narrower than the width of the source region of the prior art process made LDMOS device.

It should be known that the masking layer in the present invention may comprise any suitable layers, e.g., a photo-resist layer.

Persons of ordinary skill in the art should know that the LDMOS device may comprise more than one pair of transistors T1 and T2. The other transistors could be formed with the process described above together with the transistors T1 and T2.

Although FIGS. 4a-g shows a process of fabricating the LDMOS device, the present invention could be adopted to form other suitable semiconductor devices with the step of large-angle-tilt dopants implantation through an opening of a block layer.

It should be known that the doping type for each region may be in an alternating type, for example, the N type regions may be replaced with P type regions while the P type regions may be replaced with N type regions. In one embodiment as claimed in the appended claims, the first doping type may be N type and the second doping type may be P type. And in another embodiment, the first doping type is P type and the second doping type is N type.

The N type doping substance can be selected from one of the following: nitrogen, phosphorus, arsenic, antimony, bismuth and the combination thereof, while the P type doping substance can be selected from one of the following: boron, aluminum, gallium, indium, thallium and the combination thereof.

Obviously many modifications and variations of the present invention are possible in light of the above teachings. It is therefore to be understood that within the scope of the appended claims the invention may be practiced otherwise than as specifically described. It should be understood, of course, the foregoing disclosure relates only to a preferred embodiment (or embodiments) of the invention and that numerous modifications may be made therein without departing from the spirit and the scope of the invention as set forth in the appended claims. Various modifications are contemplated and they obviously will be resorted to by those skilled in the art without departing from the spirit and the scope of the invention as hereinafter defined by the appended claims as only a preferred embodiment(s) thereof has been disclosed.

What is claimed is:

1. A manufacturing process of a semiconductor device, comprising:
   forming a well region of a first doping type in a semiconductor substrate;
   forming a gate insulating layer above the well region;
   forming a gate layer above the gate insulating layer;
   forming, above the gate layer, a masking layer having an opening for defining a body region in an upper part of the well region;
   etching through the gate layer under the opening of the masking layer to expose the well region, wherein the gate layer has sidewalls above the defined body region after etching;
   implanting dopants of a second doping type into the well region through the opening of the masking layer to form the body region;
   implanting dopants of the first doping type into the body region in a manner of large-angle-tilt dopants implantation to form source regions respectively for a first transistor and a second transistor, using both of the gate layer and the masking layer as a block layer for large-angle-tilt dopants implantation, wherein the width of the opening for the masking layer is the same with the width of the opening for the gate layer;
   removing the masking layer after implanting dopants of the first doping type into the body region;
   forming gates respectively for the first transistor and the second transistor;
   forming drain pickup regions respectively for the first transistor and the second transistor; and
   forming, for both of the first transistor and the second transistor, a body pickup region;
   wherein during the large-angle-tilt dopants implantation, a thickness of the block layer, a width of the opening for defining the body region, and an angle between an implantation direction and the side wall of the gate layer, are defined such that the width of each source region is in a range of 0.1 μm~0.15 μm.

2. A method for fabricating a semiconductor device, comprising:
   forming a block layer above a well region of a first doping type in a semiconductor substrate, wherein the block layer has an opening for defining a first region in an upper part of the well region and has sidewalls at sides of the opening;
   implanting dopants of a second doping type into the well region through the opening of the block layer to form the first region;
   implanting dopants of the first doping type into the first region in the manner of large-angle-tilt dopants implantation to form a second region for a first transistor, and to form a third region for a second transistor, wherein the width of the opening for the masking layer is the same with the width of the opening for the gate layer; and
   forming, for both of the first transistor and the second transistor, a fourth region between the second region and the third region;
   wherein a thickness of the block layer, a width of the opening for defining the first region, and an angle between an implantation direction and the sidewall of the block layer are defined such that the width of both the second region and the third region is in a range of 0.1 μm~0.15 μm.

3. A manufacturing process of a LDMOS device comprising a first transistor and a second transistor, comprising:
   forming a well region in a semiconductor substrate;
   forming a gate insulating layer above the well region;
   forming a gate layer above the gate insulating layer;
   forming a top gate seal layer above the gate layer;
   forming a first masking layer above the top gate seal layer;
   etching through the top gate seal layer and the gate layer under an opening of the first masking layer to expose an opening for defining a body region in an upper part of the well region, wherein the gate layer has sidewalls above the defined body region after etching;
   implanting P type dopants into the well region under the opening of the first masking layer to form the body region in the upper part of the well region;
   implanting N type dopants into the body region in a manner of large-angle-tilt dopants implantation to form a first source region for the first transistor, and to form a second source region for the second transistor, using the gate insulating layer, the gate layer, the top gate seal layer and the first masking layer as a block layer for large-angle-tilt dopants implantation;
   removing the first masking layer;
   forming a second masking layer above an upper surface of the semiconductor substrate;
   etching the gate layer through openings of the second masking layer to form a first gate for the first transistor, and to form a second gate for the second transistor;
   removing the second masking layer;
   forming a third masking layer above the upper surface of the semiconductor substrate;
   implanting N type dopants into the well region under openings of the third masking layer to form a first drain pickup region for the first transistor, and to form a second drain pickup region for the second transistor;
   removing the third masking layer;

forming a fourth masking layer above the upper surface of the semiconductor substrate;

implanting P type dopants into the well region under opening of the fourth masking layer to form a body pickup region for both the first transistor and the second transistor; and removing the fourth masking layer.

4. The manufacturing process of claim 3, wherein during large-angle-tilt dopants implantation, an angle between an implantation direction and the sidewall of the gate layer is in a range of 15 degree to 30 degree.

5. The manufacturing process of claim 3, wherein a thickness of the block layer, a width of the opening for defining the body region, and an angle between an implantation direction and the sidewall of the gate layer, are defined such that the width of each source region is in a range of 0.1 μm~0.15 μm.

6. The manufacturing process of claim 3, wherein a width of the opening for defining the body region is in a range of 0.3 μm~0.5 μm.

* * * * *